(12) United States Patent
Hagihara

(10) Patent No.: US 6,429,688 B2
(45) Date of Patent: Aug. 6, 2002

(54) SEMICONDUCTOR INTEGRATED CIRCUIT

(75) Inventor: Yasuhiko Hagihara, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/798,997

(22) Filed: Mar. 6, 2001

Related U.S. Application Data

(63) Continuation-in-part of application No. 09/351,321, filed on Jul. 12, 1999, now Pat. No. 6,229,340.

(30) Foreign Application Priority Data

Jul. 15, 1998 (JP) .......................................... 10-200731

(51) Int. Cl.$^7$ ............................................. H03K 19/096
(52) U.S. Cl. .............................. 326/95; 326/93; 326/97; 326/98; 326/112
(58) Field of Search .............................. 326/93, 95, 97, 326/98, 112

(56) References Cited

U.S. PATENT DOCUMENTS

| | | | | |
|---|---|---|---|---|
| 5,208,489 A | * | 5/1993 | Houston | 326/121 |
| 5,532,625 A | * | 7/1996 | Rajivan | 326/34 |
| 5,572,151 A | * | 11/1996 | Hanawa et al. | 326/113 |
| 5,677,641 A | * | 10/1997 | Nishio et al. | 326/121 |
| 6,104,212 A | * | 8/2000 | Curran | 326/112 |
| 6,229,340 B1 | * | 5/2001 | Hagihara | 326/93 |

FOREIGN PATENT DOCUMENTS

| | | |
|---|---|---|
| JP | 298213 | 4/1990 |
| JP | 5268065 | 10/1993 |
| JP | 629834 | 2/1994 |
| JP | 1056373 | 2/1998 |

* cited by examiner

*Primary Examiner*—Michael G. Lee
*Assistant Examiner*—Steven S. Paik
(74) *Attorney, Agent, or Firm*—Young & Thompson

(57) ABSTRACT

A semiconductor integrated circuit includes a first transistor of a first conductivity-type having a source connected to a first source line and a drain; a second transistor of a second conductivity-type having a source connected to a second source line and a drain; and a plurality of third transistors of the second conductivity-type connected in series between the drain of the first transistor and the drain of said second transistor, each of said third transistors having a gate for receiving an input signal. The second transistor and at least one and not all of the third transistors have a threshold voltage lower than a threshold voltage of the others of the third transistors.

1 Claim, 3 Drawing Sheets

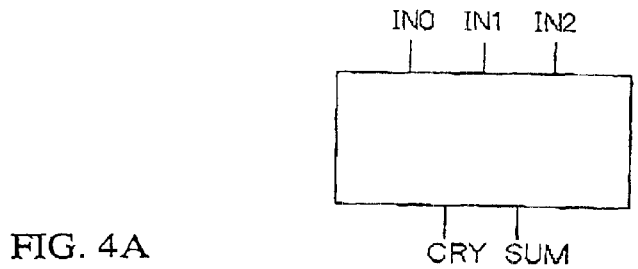
FIG. 4A
CRY = (IN0*IN1)+(IN1*IN2)+(IN2*IN0)
SUM = IN0 ^ IN1 ^ IN2
( ^ = exclusive or)
FIG. 4B
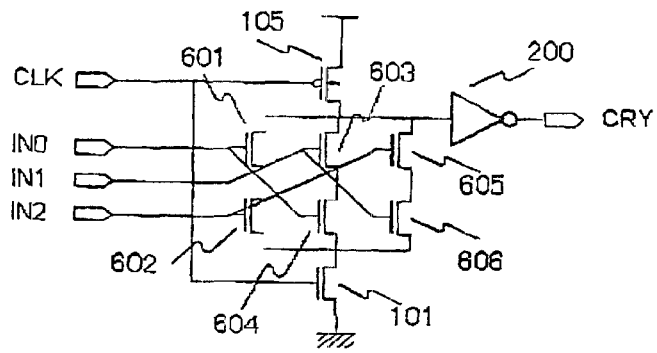
FIG. 4C
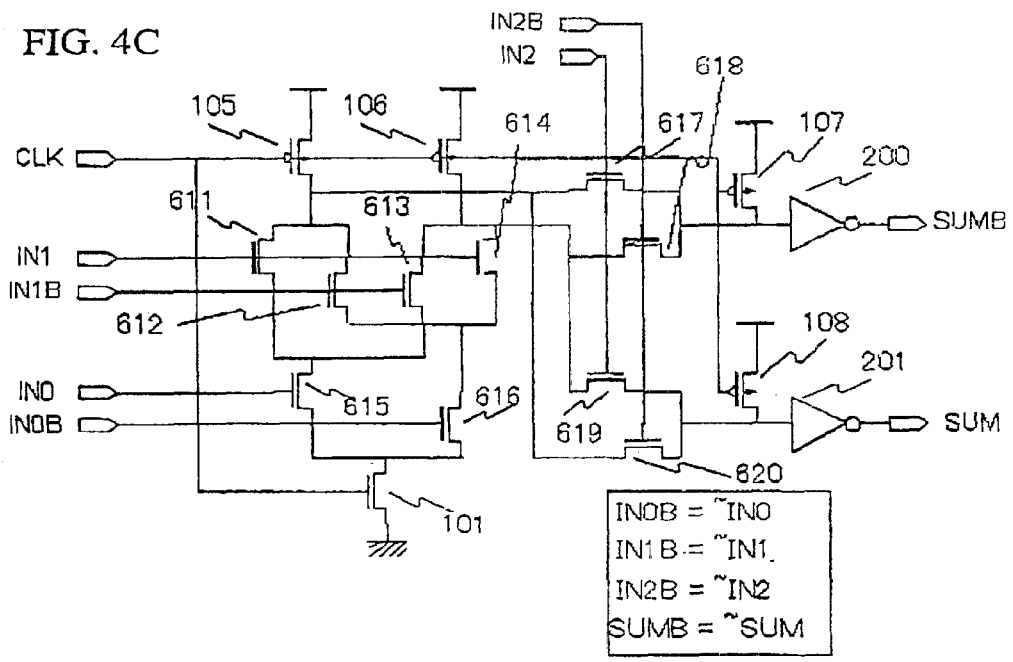
IN0B = ~IN0
IN1B = ~IN1
IN2B = ~IN2
SUMB = ~SUM

US 6,429,688 B2

1

SEMICONDUCTOR INTEGRATED CIRCUIT

RELATED APPLICATION

This application is a continuation-in-part of application Ser. No. 09/351,321, filed on Jul. 12, 1999, now U.S. Pat. No. 6,229,340 the entire contents of which are hereby incorporated by reference.

BACKGROUND OF THE INVENTION (a) Field of the Invention

The present invention relates to a semiconductor integrated circuit, more in particular to a basic circuit of a semiconductor integrated circuit constituting a memory LSI or a logic LSI.

(b) Description of the Related Art

A basic logic element having a small input capacitance has been proposed as a basic circuit of a semiconductor integrated circuit. Such a basic logic element is described, for example, in a report entitled "Current-Voltage Characteristics of Small Size MOS Transistors" by B. Hoeneisen appearing in "IEEE Trans. Electron Devices", vol.19, p108–113 published from IEEE in 1972.

FIG. 1 shows a domino circuit including the above mentioned basic logic elements. Numerals 504 and 500 denote a power supply line and a ground line, respectively. The source of a p-channel MOS transistor 105 is connected to the power supply line 504, and the drain thereof is connected to an input of an output inverter 200. The source of an n-channel MOS transistor 101 is connected to the ground line 500. Between the drain of the p-channel MOS transistor 105 and the drain of the n-channel MOS transistor 101 are connected in parallel an n-channel MOS transistor 104 and a serial circuit including n-channel transistors 102 and 103. A numeral 400 denotes a clock signal which is input to the respective gates of the p-chanel MOS transistor 105 and of the n-channel MOS transistor 101. Numerals 301 to 303 denote input signals which are input to the gates of the n-channel MOS transistors 104, 103 and 102, respectively. An output signal 304 of the inverter 200 constitutes the output signal of the domino circuit.

When the clock signal 400 falls to a low level, the p-channel MOS transistor 105 turns ON to raise a node 503 to a high level to conduct a pre-charging, and the output signal 304 falls to a low level from the inverter 200. When the clock signal 400 rises to a high H level, the output signal 304 from the inverter 200 falls to a high level because the p-channel MOS transistor 105 turns OFF and the n-channel MOS transistor 101 turns ON. The both of the input signals 303 and 302 are at a high level, or the input signal 301 is at a high level to make the potential of the node 503 to a low level. The potential of the node 503 remains unchanged and the output signal 304 remains at a low level unless both of the input signals 303 and 302 rise to a high level, and the input signal 301 rises to a high level even if the clock signal 400 rises to a high H level. In other words, this domino circuit is a logic circuit for providing an OR between data 301 and an AND of data 302 and data 303. The respective n-channel MOS transistors 101 to 104 are designed to have the same threshold values.

In the semiconductor integrated circuit, the elevation of the operation speed and the reduction of power consumption are always required.

2

SUMMARY OF THE INVENTION

It is therefore an object of the present invention, in view of the above, to provide a basic circuit employable in the above domino circuit in which elevation of its operation speed, extension of a retention time by means of reduction of a leakage current and reduction of power consumption can be attained.

The present invention provides a semiconductor integrated circuit comprising: a first transistor of a first conductivity-type having a source connected to a first source line and a drain; a second transistor of a second conductivity-type having a source connected to a second source line and a drain; and a plurality of third transistors of said second conductivity-type connected in series between the drain of said first transistor and the drain of said second transistor, each of said third transistors having a gate for receiving an input signal, said second transistor and at least one and not all of said third transistors having a threshold voltage lower than a threshold voltage of the others of said third transistors.

In accordance with the present invention, the high speed operation of the circuit, the extension of the signal retention time secured by the reduction of a leakage current and the decrease of the power consumption can be realized by serially inserting the transistors having the different threshold values between the first power source line and the second power source line.

The above and other objects, features and advantages of the present invention will be more apparent from the following description.

BRIEF DESCRIPTION OF DRAWINGS

FIG. 4A shows a carry save adder (CSA) circuit of the present invention and the logics thereof.

FIG. 4B shows a circuit for outputting the CRY signal from the CSA circuit of FIG. 4A.

FIG. 4C shows a circuit for outputting a SUM signal from the CSA circuit of FIG. 4A.

PREFERRED EMBODIMENTS OF THE INVENTION

Figure 1:
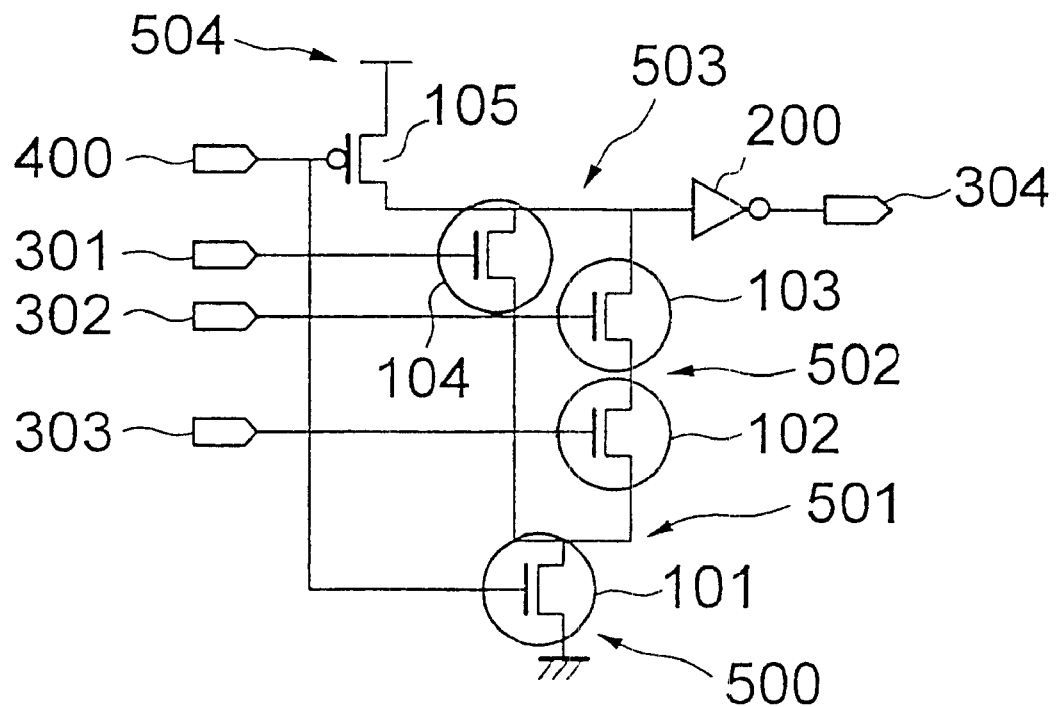
FIG. 1 shows one example of a conventional domino circuit.
Figure 2:
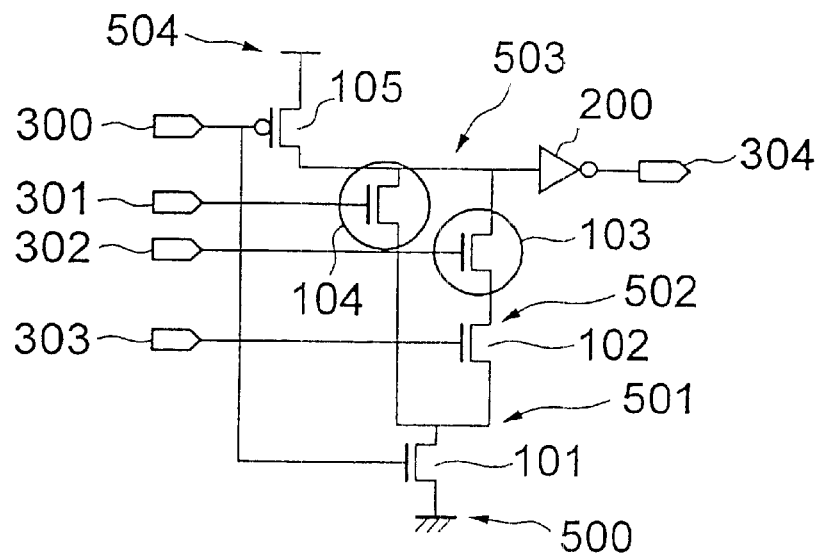
FIG. 2 shows a first embodiment of a domino circuit in accordance with the present invention.
Figure 3:
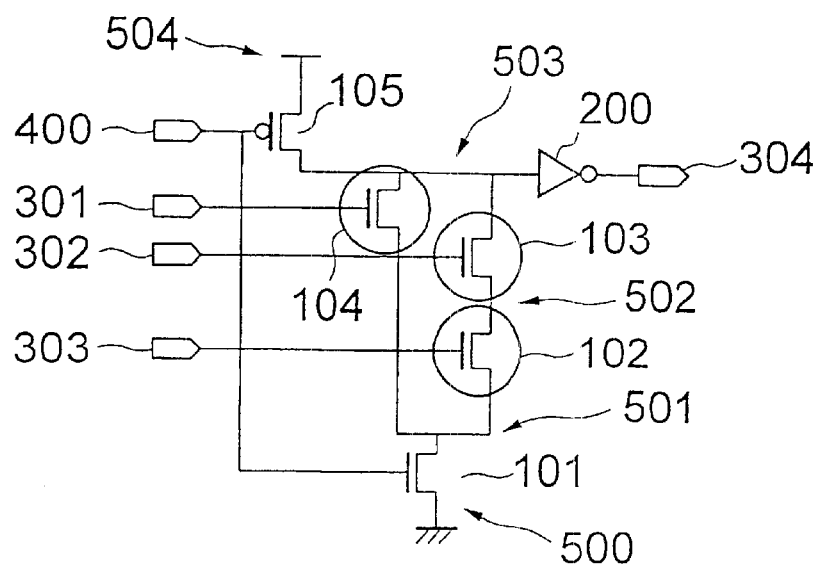
FIG. 3 shows a second embodiment of a domino circuit in accordance with the present invention.

Now, the present invention is more specifically described with reference to accompanying drawings. In FIGS. 2 to 4, the same numerals to those of FIG. 1 show the same elements of FIG. 1.

In FIG. 2, numerals 504 and 500 denote a power supply line and a ground line, respectively. The source of a p-channel MOS transistor 105 is connected to the power supply line 504, and the drain thereof is connected to an input of an output inverter 200. The source of an n-channel MOS transistor 101 is connected to the ground line 500.

Between the drain of the p-channel MOS transistor 105 and the drain of the n-channel MOS transistor 101 are connected in parallel an n-channel MOS transistor 104 and a serial circuit including n-channel transistors 102 and 103. A numeral 300 denotes a clock signal which is input to the respective gates of the p-channel MOS transistor 105 and of the n-channel MOS transistor 101. Input signals 301, 302 and 303 are employed as datum which are input to the gates of the n-channel MOS transistors 104, 103 and 102, respectively. An output signal 304 of the inverter 200 constitutes the output signal of the domino circuit.

When the clock signal 300 falls to a low level, the p-channel MOS transistor 105 turns ON to raise a node 503 to a high level to conduct a pre-charging regardless of the values of the data input signals 301 to 303, and the output signal 304 falls to a low level by the inverter 200. When the clock signal 300 rises to a high level, the p-channel MOS transistor 105 turns OFF and the n-channel MOS transistor 101 turns ON. When, in this instance, both of the input signals 3u3 and 302 are at a high level, or the input signal 301 is at a high level, the potential of the node 503 falls to a low level, and the output signal 304 rises to a high level by the inverter 200. The potential of the node 503 remains unchanged and the output signal 304 remains at a low level unless both of the input signals 303 and 302 rise to a high level and the input signal 301 rise to a high level even if the input signal 300 rises to a high level. In other words, this domino circuit is a logic circuit for providing an OR between data 301 and an AND of data 302 and data 303.

In the domino circuit of the present embodiment, the n-channel MOS transistors 101 and 102 among the above n-channel MOS transistors 101 to 104 have lower threshold values and the other n-channel MOS transistors 103 and 104 have higher threshold values. An n-channel MOS transistor included in the converter 200 may have the same threshold value as those of the n-channel MOS transistors 101 and 102 or as those of the n-channel MOS transistors 103 and 104. Or the n-channel MOS transistor in the converter 200 may have a distinct third threshold value.

The influence of a noise can be reduced by making the threshold values of the n-channel MOS transistors 103 and 104 higher and those of the n-channel MOS transistors 101 and 102 lower as mentioned when a wiring for transmitting the signals 301 and 302 is long and liable to receive the influence, and the high speed transmission of the signals can be achieved by the transistors 101 and 102 having the lower threshold values. In this case, the transistor 102 is selected from those for receiving a gate input from a short wiring which is hardly subject to a noise. The transistor 101 receives the clock signal to its gate and is selected because the noise hardly invades the clock signal wiring. If the noise overlapping with the signals 300 and 303 is known to be small in advance, the high speed operation of the whole circuit can be realized by lowering the threshold values of the n-channel MOS transistors 101 and 102 receiving the inputs therefrom.

In the above embodiment, a resistor element or a depression type MOS transistor may be employed in place of the p-channel MOS transistor. The n-channel MOS transistors and the p-channel MOS transistors may be entirely replaced with each other. Although an enhancement p-channel MOS transistor has a negative threshold value, its absolute value of the threshold value is taken into consideration.

The transistors having the different threshold values are intentionally manufactured by making different amounts of ion injection, a size of a device, a thickness of an oxide film and a density of the device during a manufacturing process, and those having individual differences occurring due to inhomogeneities during the manufacturing process are not utilized.

A domino circuit shown in FIG. 3 has a similar circuit construction to that of FIG. 2. The circuit in FIG. 3 is different from that of FIG. 2 in that the threshold value of the transistor 101 is made to be lower and those of the other transistors 102 to 104 are made to be higher. An n-channel MOS transistor included in the converter 200 may have the same threshold value as that of the transistor 101 or as those of the transistors 102 to 104 or may have a distinct third threshold value.

As mentioned earlier, the high speed operation of the circuit can be implemented by lowering the threshold value of the n-channel MOS transistor 101. However, a leakage current increases when all the threshold values of the n-channel MOS transistors 101 to 104 increase. Therefore, the threshold values of the n-channel MOS transistors 102 to 104 are designed to be higher to reduce the leakage current thereby decreasing the power consumption as well as extending a signal retention time of the circuit. Since the noise is small on the wiring for transmitting the clock signal, the probability of the malfunction due to the noise is small even when the threshold value of the transistor 101 is made to be lower.

FIG. 4A shows a carry save adder (CSA) circuit having inputs IN0, IN1 and IN2 and outputs CRY and SUM. The logics of the CRY and the SUM are shown in FIG. 4A.

FIG. 4B shows a circuit for outputting the CRY. By using the transistor having the high Vth as the nMOS transistor 101, the leakage current in the signal path from the input node of the inverter 200 toward the ground is reduced, thereby establishing the high-speed performance. The three signal paths exist from the input node of the inverter 200 toward the ground. At least one of the nMOS transistor 601 and 602, at least one of the nMOS transistor 603 and 604, and at least one of the nMOS transistor 605 and 606 may be used for obtaining similar configuration thereto.

The circuit of FIG. 4B is that for calculating a carry of a sum among three inputs IN1, IN1 and IN2. Since a circuit for transmitting these three inputs IN0, IN1 and IN2 is remote from the adder and the signal wiring is long, all the n-channels MOS transistors 601 to 606 receiving these inputs have high threshold values, and only the n-channel transistor 101 receiving the clock signal at its gate has a lower threshold value. Since the n-channel transistor 101 has the lower threshold value, a serial resistance value of the circuit becomes smaller to elevate the operation speed. On the other hand, reliability of the signal transmission can be secured by establishing the threshold values of the n-channel transistors 601 and 606 higher for receiving the signals from the wiring which is long and susceptible to noises.

FIG. 4C is a circuit for outputting the SUM and the SUMB which is a logic inversed signal thereof. IN0B, IN1B and IN2B are the logic inversed signals of IN0, IN1 and IN2, respectively. At least one of the nMOS transistors in the signal paths from the input node of the inverters 200 and 201 toward the ground is designed to have a higher Vth to reduce the leakage current to establish the high-speed performance. This can be realized by using the transistors having the higher Vth as the nMOS transistors of the below combinations. 1) 101, 2) 615 and 616, 3) 611 to 614 and 4) 617 to 620.

A circuit shown in FIG. 4C is that for making a sum of input signals IN1T, IN1B, IN0T and IN0B under existence of carries IN2T and IN2B. An output SUMT of the circuit exhibits a sum of input datum IN0T, IN1T and IN2T, and an output SUMB exhibits a sum of input datum IN0B, IN1B and IN2B.

Since the wirings of the carries IN2T and IN2B are short in this circuit, the probability of receiving a noise is small. N-channel transistors 617 to 620 receiving these signals are made to have higher threshold values, and the other n-channel transistors 101, 108 and 611 to 616 are made to have lower threshold values. In this way, the high speed operation of the circuit can be attained by making lower the threshold value of the transistor for receiving the signal as the input from the wiring in which the probability of receiving the influence of the noise is small in the n-channel transistor connected in series with a power source line.

Since the above embodiments are described only for examples, the present invention is not limited to the above embodiments and various modifications or alternations can be easily made therefrom by those skilled in the art without departing from the scope of the present invention.

What is claimed is:

1. A semiconductor integrated circuit comprising:

a first transistor of a first conductivity-type having a source connected to a first source line and a drain;

a second transistor of a second conductivity-type having a source connected to a second source line and a drain; and a plurality of third transistors of said second conductivity-type connected in series between the drain of said first transistor and the drain of said second transistor, each of said third transistors having a gate for receiving an input signal, said second transistor and at least one and not all of said third transistors having a threshold voltage lower than a threshold voltage of the others of said third transistors; and the semiconductor integrated circuit implementing a carry save adder.

* * * * *